(12) United States Patent
van den Heuvel

(10) Patent No.: US 11,233,480 B2
(45) Date of Patent: Jan. 25, 2022

(54) SIGNAL GENERATOR

(71) Applicant: Stichting IMEC Nederland, Eindhoven (NL)

(72) Inventor: Johan van den Heuvel, Geldrop (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 17/128,882

(22) Filed: Dec. 21, 2020

(65) Prior Publication Data

US 2021/0194430 A1   Jun. 24, 2021

(30) Foreign Application Priority Data

Dec. 20, 2019  (EP) ..................................... 19218393

(51) Int. Cl.
*H03C 3/09* (2006.01)
*H03L 7/093* (2006.01)

(52) U.S. Cl.
CPC ......... *H03C 3/0991* (2013.01); *H03C 3/0958* (2013.01); *H03L 7/093* (2013.01); *H03L 2207/50* (2013.01)

(58) Field of Classification Search
CPC .......... H03C 2200/0041; H03C 3/0991; H03C 2200/005; H03C 3/0941; H03C 3/095; H03C 3/0958; H03L 2207/50; H03L 7/093
See application file for complete search history.

(56) References Cited

U.S. PATENT DOCUMENTS

| 8,803,627 B1 | 8/2014 | Xu et al. |
| 2009/0252269 A1 | 10/2009 | Gunturi et al. |
| 2010/0277211 A1* | 11/2010 | Geng ................... H03C 3/0966 327/158 |

(Continued)

OTHER PUBLICATIONS

Wu, Wanghua, Robert Bogdan Staszewski, and John R. Long. "A 56.4-to-63.4 GHz multi-rate all-digital fractional-N PLL for FMCW radar applications in 65 nm CMOS." IEEE Journal of solid-state circuits 49.5 (2014): 1081-1096. (Year: 2014).*

(Continued)

*Primary Examiner* — Ryan Johnson
(74) *Attorney, Agent, or Firm* — McDonnell Boehnen Hulbert & Berghoff LLP

(57) ABSTRACT

A signal generator has a nominal frequency control input and a modulation frequency control input and comprises an oscillator, with a first set of capacitors at least partially switchably connectable for adjusting a frequency of the oscillator as part of a phase-locked loop, and a second set of capacitors comprised in a modulation stage of the oscillator, switchably connectable for modulating the frequency and controlled by the modulation frequency control input; a modulation gain estimation stage configured to determine a frequency-to-capacitor modulation gain; and a modulation range reduction module configured for clipping a modulation range of the oscillator to a range achievable using the second set of capacitors, using the modulation gain averaging out, in time, a phase error caused by the said clipping; and mimicking the said clipping, additively output to the nominal frequency control input to compensate said PLL for the said modulation.

15 Claims, 3 Drawing Sheets

(56) References Cited

U.S. PATENT DOCUMENTS

2015/0263670 A1    9/2015  Fan et al.
2019/0068206 A1*   2/2019  Liao .................... H03C 3/0966

OTHER PUBLICATIONS

Extended European Search Report and Written Opinion, European Application No. 19218393.7, dated Jul. 29, 2020, 5 pages.
Gunturi, Sarma, Jawaharlal Tangudu, Sthanunathan Ramakrishnan, Jayawardan Janardhanan, Debapriya Sahu, and Subhashish Mukherjee. "Principal architectural changes in polar transmitter in DRP design for WLAN." In 2013 National Conference on Communications (NCC), pp. 1-5. IEEE, 2013.

* cited by examiner

SIGNAL GENERATOR

CROSS-REFERENCE TO RELATED APPLICATIONS

The present application is a non-provisional patent application claiming priority to European Patent Application No. EP 19218393.7, filed Dec. 20, 2019, the contents of which are hereby incorporated by reference.

FIELD OF THE DISCLOSURE

The present disclosure relates to a signal generator.

BACKGROUND

Standards such as IEEE 802.11b/g/n and IEEE 802.11ah pose stringent error vector magnitude (EVM) and spectral mask requirements in, for example, wideband OFDM transmission. To meet such requirements, digitally-modulated signal generators, generating signals to be transmitted, such as polar signal generators, may require oversampling in the digital modulation circuitry of data to be modulated, typically more than ten times the modulation data symbol rate. Such oversampling of the data, and anti-alias filtering, may result in sharp phase transitions at a high rate. These fast phase transitions may require a polar signal generator to have a large frequency swing, for example up to +/−100 MHz.

Further, capacitors as used for signal generation are subject to process, voltage, and temperature variations. Typically, such variations in capacitors used for frequency modulation in a digitally-controlled oscillator (DCO) may be in the order of +/−30%.

SUMMARY

The present disclosure provides a signal generator capable of meeting strict error vector magnitude (EVM) and spectral mask requirements, and handling capacitor process voltage and temperature (PVT) variations, at lowest possible power consumption.

To this end, there is provided a signal generator having a nominal frequency control input, and a modulation frequency control input and comprising an oscillator, with a first set of capacitors at least partially switchably connectable for adjusting a frequency of the oscillator as part of a phase-locked loop, PLL, as set by the nominal frequency control input, and a second set of capacitors comprised in a modulation, MOD, stage of the oscillator, switchably connectable for modulating the frequency and controlled by the modulation frequency control input; a modulation gain estimation stage configured to determine, derived from the modulation frequency control input and a state of the PLL, a frequency-to-capacitor modulation gain; and a modulation range reduction module connected between said modulation frequency input and said modulation stage and configured for clipping a modulation range of said oscillator to a range achievable using said second set of capacitors, using said modulation gain; averaging out, in time, a phase error caused by said clipping; and mimicking said clipping, additively output to said nominal frequency control input to compensate said PLL for said modulation.

Clipping the modulation range of the oscillator should be understood as ensuring that the frequency of the oscillator, as modulated, cannot be below or above respective lower and upper thresholds, which may be programmable or predetermined.

As frequency-to-capacitor modulation gain should be understood as a numeric conversion factor relating a modulation frequency or modulation frequency step, which may be expressed in hertz, to the switchably connectable capacitors in the second set of capacitors. As such, it may relate the frequency to a number of switched-in capacitors in the second set of capacitors per frequency unit, or, for example to a nominal switched-in capacitance per frequency unit.

By performing clipping of the modulation range using a known modulation gain, it is possible to clip the modulation range in terms of units of capacitors at the in the second set of capacitors, allowing the modulation range to be clipped at exactly the actual limits of the second set of capacitors. Hereby, the available modulation range as determined by the second set of capacitors can be used, reducing the need for redundancy in the oscillator design. As a result, the second set of capacitors can be made smaller, decreasing complexity and thereby power consumption of the oscillator. This allows for wide band modulation with reduced oscillator complexity, and thereby lowered power consumption without compromising performance.

In particular, the requirements for a high dynamic range in the second set of capacitors used for modulation, due to the requirements for a large frequency swing and large phase jump, and for meeting spectral requirements, and the overhead to follow PVT variations, otherwise resulting in a highly complex oscillator, may be reduced.

Furthermore, the resulting decreased capacitor complexity results in it being easier to meet timing constraints during circuit design and reduces parasitic coupling from switching circuitry into the oscillator as noise, due to the reduced number of control lines.

The modulation gain estimation stage may continuously update the estimated frequency-to-capacitor modulation gain in response to voltage and temperature variations.

Clipping the modulation range causes a phase error in the generated signal. This phase error is averaged out, in time, to maintain long-term phase coherency in the generated signal, i.e., the residue left after clipping can be compensated for. Hereby, the error can be spread in time by feedback, feedforward, or a combination of both.

Through the mimicking of the clipping, additively output to the nominal frequency control input, the PLL is compensated for the modulation, including the effect of the clipping, ensuring long-term phase stability for the PLL and prevents a modulation-data-dependent phase error.

According to one embodiment, the said state of the PLL is a time-to-digital converter, TDC, output.

According to one embodiment, the signal generator comprises a modulation range reduction block providing the said clipping and the said averaging, where the modulation range reduction block comprises an input block converting the modulation frequency control to units of capacitors using the modulation gain; a quantization and limiting block providing the clipping and output to the modulation stage; and a delay block input with a difference between an input and an output of the quantization and limiting block and additively output to the input of the quantization and limiting block.

According to one embodiment, the signal generator comprises a compensation branch block providing the said mimicking, the compensation branch block comprising a quantization and limiting block mimicking the said clipping of the modulation range reduction block; and a delay block input with a difference between an input and an output of the quantization and limiting block and additively output to the input of the quantization and limiting block.

According to one embodiment, the oscillator is a digitally-controlled oscillator, DCO.

According to one embodiment, the PLL may is an all-digital phase-locked loop, AD-PLL.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
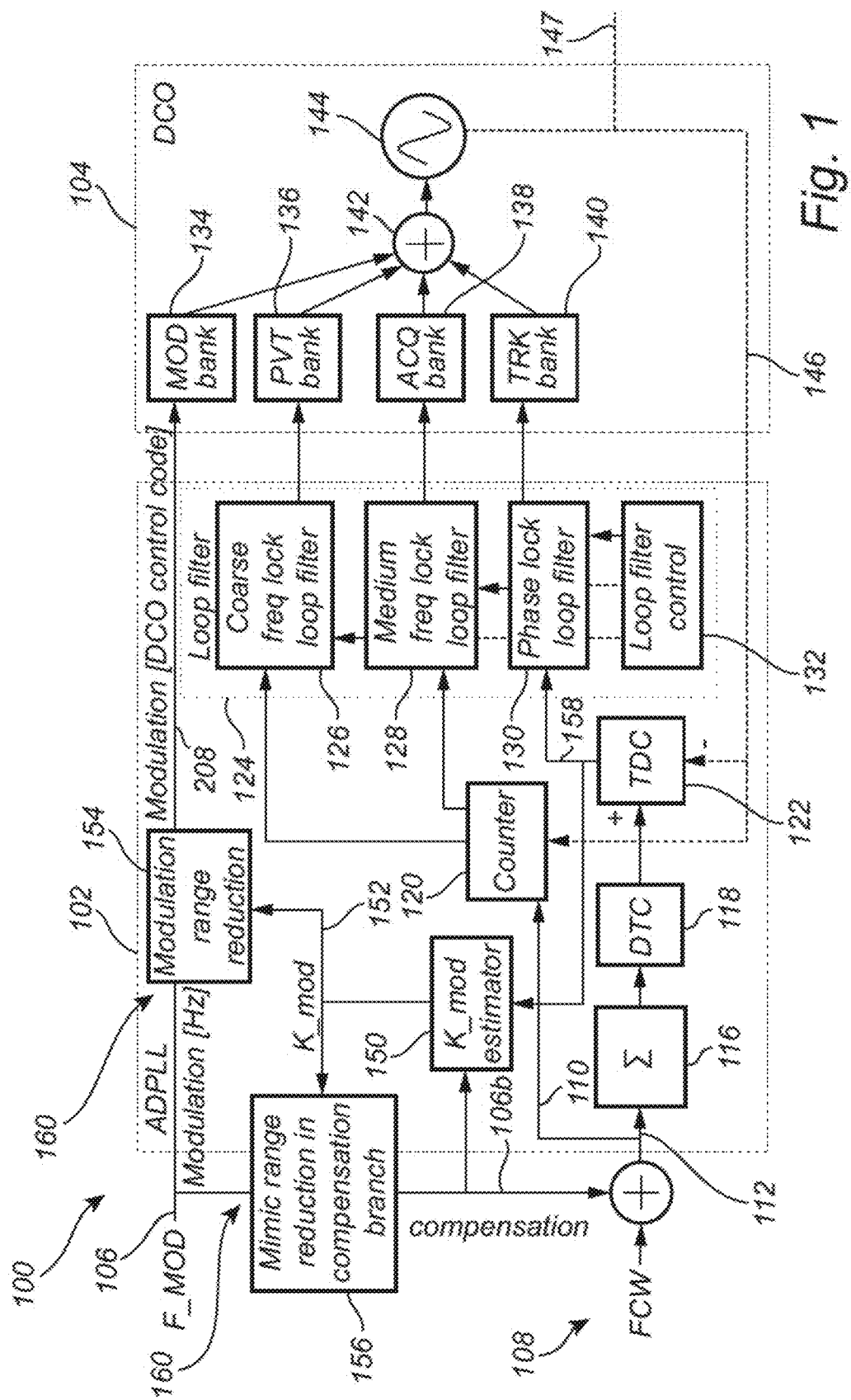
FIG. 1 schematically shows a signal generator.

FIG. 1 shows a block diagram of a signal generator 100. The signal generator 100 comprises an all-digital phase-locked loop (ADPLL) control block 102 and a digitally-controlled oscillator (DCO) block 104. The signal generator 100 may form part of a wireless transmitter or a wireless transceiver (not shown in its entirety).

The DCO block 104 comprises a number of banks of switchably connectable capacitors whose capacitances are added 142 together for digitally controlling the frequency of the oscillator 144. The banks comprise a "PVT" bank 136 for coarse frequency control, an "ACQ" bank 138 for medium frequency control, and a "TRK" bank 140 for fine frequency control. Additionally, one or more of the banks may comprise a fixed capacitance.

The ADPLL control block 102 controls the DCO block 104 and its associated phase-locked loop 146, where the generated signal 147 is looped back into the ADPLL control block 102. A loop filter 124 controls the "PVT" 136, "ACQ" 138, and "TRK" 140 capacitor banks of the DCO block 104. In particular, each of the "PVT" 136, "ACQ" 138, and "TRK" 140 capacitor banks are controlled, respectively, by a coarse frequency lock loop filter 126, a medium frequency lock loop filter 128, and a phase-lock loop filter 130. The coarse frequency lock loop filter 126, the medium frequency lock loop filter 128, and the phase-lock loop filter 130 are controlled by a loop filter control block 132. Thus, the "PVT" 136, "ACQ" 138, and "TRK" 140 banks form a first set of capacitors at least partially switchably connectable for adjusting the frequency of the oscillator 144 as part of the phase-locked loop 146.

Additionally, a "MOD" capacitor bank 134 may be used for frequency modulating the oscillator output signal 147.

The capacitors of the "MOD" bank 134 directly control the capacitance of the oscillator 144, but they do not form part of the phase-locked loop 146. They form a second set of capacitors separate from the capacitors of the "PVT" 136, "ACQ" 138, and "TRK" 140 banks, i.e., the first set of capacitors.

A frequency control word FCW 108 may be input to the ADPLL control block 102 for controlling a nominal oscillator frequency, thus forming a nominal frequency control input of the signal generator 100. Further, for modulating the frequency generated by the DCO 147, the signal generator 100 has a modulation frequency control input in the form of a frequency modulation word F_MOD 106. Modulation is performed using the capacitors of the "MOD" bank 134, controlled as derived from the frequency modulation word F_MOD 106, as will be explained in the following.

The frequency control word FCW 108, possibly as modified through modulation, as will be detailed in the following, is fed wholly or in part, to a counter 120 and to an edge prediction block 116. For example, an integer part, corresponding to coarser frequency control, may be fed to the counter 120, and a fractional part 112, corresponding to finer frequency control, may be fed to the edge prediction block 116.

The counter 120 is configured to count the number of cycles of the looped-back 146 generated signal 147 relative to pulses of a reference clock (not shown). The result relative to the integer part 110 of the frequency control word is fed to the loop filter 124, in particular to the coarse frequency lock loop filter 126 and the medium frequency lock loop filter 128, completing the phase-locked loop 146.

The fractional part 112 of the frequency control word is input to an edge prediction block 116, which calculates a phase advance that the generated signal should have relative to the reference clock. This calculated phase advance is converted by a digital-to-time converter (DTC) 118 to a phase reference signal, which is fed into a phase detection stage 122, here in the form of a time-to-digital converter (TDC) 122, which compares the phase of the reference signal with that of the generated signal 126. The result of this comparison is fed into the loop filter 124, in particular the phase-locked loop filter 130, completing the phase-locked loop 146.

In the process of locking the PLL 146, a coarse frequency lock may first be performed using the counter 120, followed by finer frequency lock performed using the TDC 122.

The signal generator 100 may be used for polar modulation, wherein modulation through the frequency modulation word F_MOD 106 may be combined with amplitude modulation in an amplifier stage (not shown).

A modulation gain estimation stage 150 is configured to receive frequency control information, which, as shown, may be the frequency modulation word 106, as modified 106b by the compensation branch block 156 (see below), and the output 158 of the TDC 122.

The modulation gain estimation stage 150 may maintain an estimate 152 of the modulation gain K_mod, i.e., an instantaneous frequency-to-capacitor conversion factor, output to the modulation range reduction block 154 and the compensation branch block 156, which, respectively, use the estimated modulation gain K_mod 152 for modulating the "MOD" bank 134 of the DCO 104, and for compensating the PLL 146, as will be explained below. The output 158 of the TDC 122, as part of the PLL 132, provides a measure on how well the PLL 146 is locked relative the reference clock. During modulation, in the case of perfect compensation of the PLL 146 through the compensation branch block 156, i.e., a correct value of the modulation gain K_mod 152, the output 158 of the TDC 122 will be unaffected by modulation. However, if the estimated modulation gain K_mod 152 is off, modulation controlled through the frequency modulation word F_MOD 106, will affect the locking state of the PLL 146 and thus the output of the TDC 122. The modulation gain estimation stage 150 may therefore use the output of the TDC 122 to adjust its estimation of the modulation gain K_mod 152, to minimize the output 158 of the TDC 122, thus forming a control loop through the DCO 104 for the modulation gain K_mod.

Thus, the modulation gain K_mod may be determined by the modulation gain estimation stage 150, as derived from a state of the PLL 146, i.e., in this case, the output 158 of the TDC 122, and the frequency modulation word 106.

For example, a change in the frequency modulation word may be correlated to the TDC 122 output 158 by multiplying the TDC 122 output 158 with the frequency modulation word, and low-pass filtering the output. The output of such a low pass filter can be used to increment or decrement the modulation gain estimate K_mod 152. When the frequency modulation word F_MOD 106 and TDC 158 output are uncorrelated the output of the lowpass filter reverts to zero and the modulation gain estimate K_mod is stabilized. The modulation gain estimation stage 150 may continuously provide an instantaneous estimation of the modulation gain K_mod, allowing for adaption every modulation cycle to voltage and/or temperature changes, for example, in the event of a voltage drop or temperature change on the DCO.

A modulation range reduction module 160, connected between the frequency modulation word F_MOD input 106 and the "MOD" bank 134 comprises the modulation range reduction block 154 and the compensation branch block 156. The output 106*b* of the compensation branch block 156 is additively output to the nominal frequency control input in the form of the frequency control word FCW 108.

Figure 2:
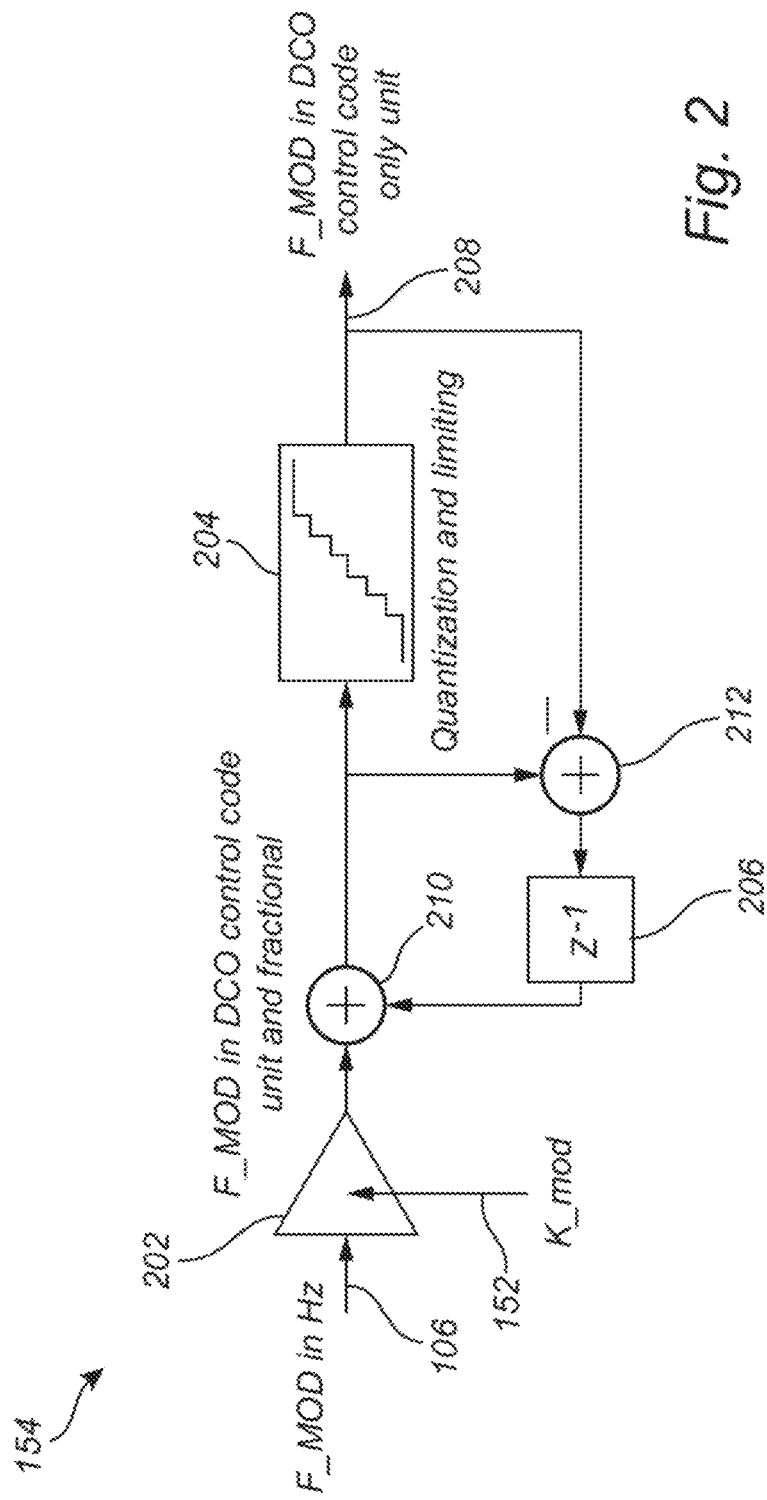
FIG. 2 schematically shows a modulation range reduction block comprised in a modulation range reduction module of the signal generator of FIG. 1.

FIG. 2 shows a block diagram of the modulation range reduction block 154.

The modulation range reduction block 154 comprises an input block 202 converting the frequency modulation word 106 F_mod, expressed in units of frequency, to a modulation control code expressed in units of capacitors, by multiplication by the modulation gain K_mod 152, received from the modulation gain estimation stage 150. Thus, the modulation gain K_mod translates frequency steps expressed in hertz to DCO capacitor unit steps, which may be expressed either in a number of switched-in capacitors, relative to some baseline number, or, alternatively in terms the capacitance of those capacitors. The modulation control code thus translated may be expressed as an integer number of capacitors in the "MOD" bank 134, and a fractional part.

Further, the modulation range reduction block 154 comprises a quantization and limiting block 204.

The quantization and limiting block 204 is configured to clip the control code 208 into the DCO at a known level, such that it cannot be below or above respective programmable lower and upper thresholds. With the signal expressed in units of capacitors, this clipping may be performed right at the limit of the maximum frequency swing achievable by the capacitors in the "MOD" bank 134.

Further to the clipping, the quantization and limit block 204 rounds the control code to a whole number of switched-in capacitors in the "MOD" bank 134, which may correspond to rounding the control code to an integer.

Thus, the quantization and limiting block 204 is configured for clipping a modulation range of said oscillator to a range achievable using the second set of capacitors in the "MOD" bank 134, and output to the modulation stage of the DCO, i.e., the "MOD" bank 134.

Further, the modulation range reduction block 154 comprises a delay block 206. The delay block 206 is input with a difference between the input and the output of the quantization and limiting block 204, as calculated by a subtractor 212, and additively output, through an adder 210, with a delay, of typically one modulation cycle, provided by the delay block 206, to the input of the quantization and limiting block 204, so that in the next modulation cycle the error, represented by the said difference, is added on top of the signal going into the quantization and limiting block 204. This provides a feedback loop for averaging out averaging out, in time, the phase error caused by the quantization and/or clipping by the quantization and limiting block 204.

In a first example, a modulation frequency F_MOD of 60.125 MHz, may, with a K_MOD value of 0.72 "MOD" bank 134 capacitors per MHz, be converted by the input block 202 to a DCO control code 43.3. As a starting point, or if no error is present from the previous modulation cycle, the output of the delay block 206 may be zero. Thus, the output of the adder 210, as input into the quantization and limiting block 204 is 43.3. The quantization and limiting block 204 may quantize this value by rounding it to 43. In this example, the actual range of capacitors provided by the "MOD" bank 134 may be −32 to +31. Thus, the quantization and limiting block 204 may limit this value by clipping it to 31. The error from quantization and limiting, as output by the subtractor 212, is 43.3−31=12.3. This value is delayed one modulation cycle by the delay block 206 and added at the next modulation cycle at the input to the quantization and limiting block 204 to compensate for the rounding and clipping of the quantization and limiting block 204 in the preceding modulation cycle.

In a second example, a modulation frequency F_MOD of 30.0625 MHz, may, still with a K_MOD value of 0.72 "MOD" bank capacitors per MHz, be converted by the input block 202 to a DCO control code 21.65. Again assuming the output of the delay block 206 to be zero, the output of the adder, as input into the quantization and limiting block 204 is 21.65. The quantization and limiting block 204 may quantize this value by rounding it to 22. Still assuming the actual range of capacitors provided by the "MOD" bank 134 to be −32 to +31, the value 22 is within this range. Thus, quantization and limiting block 204 outputs 22 to the DCO. The error from quantization, as output by the subtractor 212, is now 21.65−22=−0.35. This value is delayed one modulation cycle by the delay block 206 and added at the next modulation cycle to compensate for the rounding of the quantization and limiting block 204.

Figure 3:
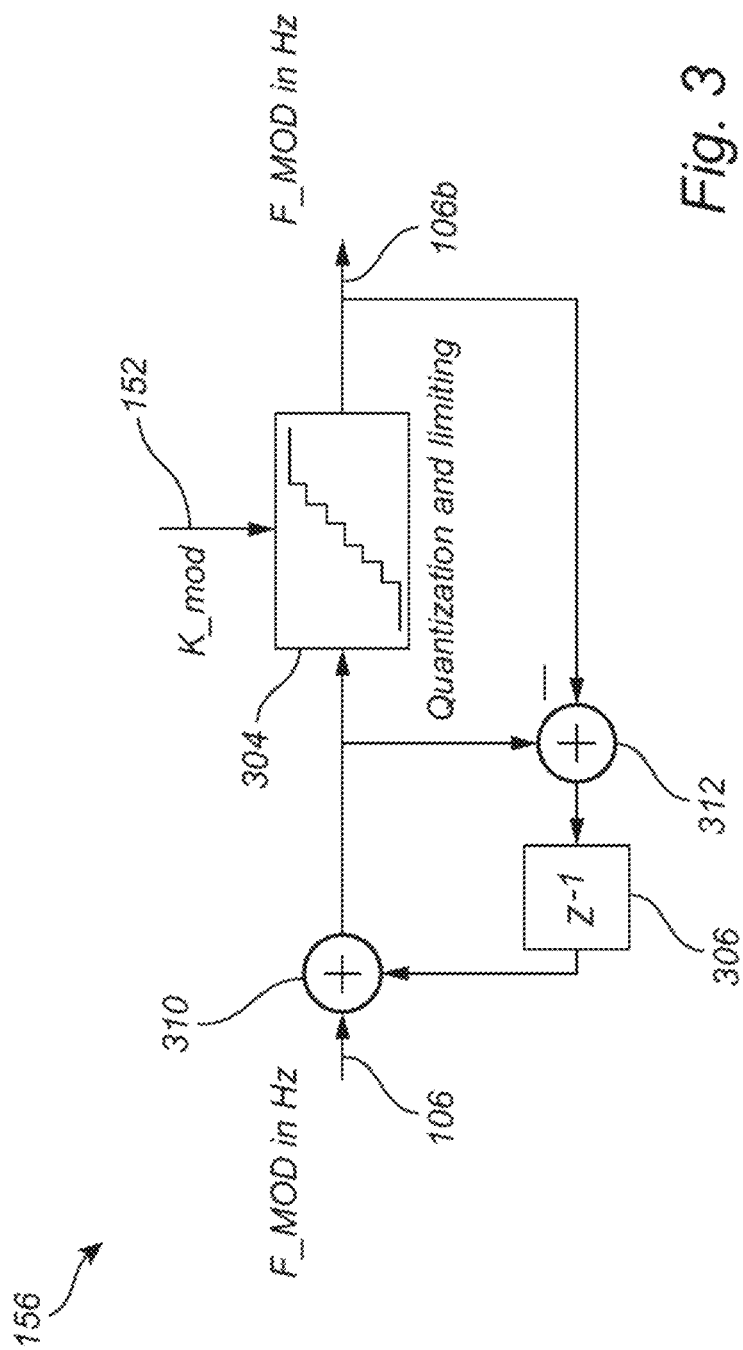
FIG. 3 schematically shows a compensation branch block comprised in the modulation range reduction module of the signal generator of FIG. 1.

The compensation branch block 156 is detailed in FIG. 3.

The purpose of the compensation branch block 156 is to mimic the clipping performed by the quantization and limiting block 204 of the modulation range reduction block 154. Through the mimicking of the clipping, additively output to the nominal frequency control input, the PLL is compensated for the modulation, including the effect of the clipping, ensuring long-term phase stability for the PLL.

For example, it may be that a jump of 100 MHz is clipped by the quantization and limiting block 204 to a physical limit, as set by the "MOD" bank of capacitors, of 50 MHz and spread, through the delay block 206, over two modulation cycles, instead of one. Without the mimicking, this may lead to a very large frequency error in the PLL 146, several orders of magnitude bigger than in normal operation, which may cause the PLL 146 to unlock. Since the capacitor banks 136, 138, 140 pars of the PLL 146 may provide fine grained frequency control, phase stability may be maintained with very fine granularity.

The compensation branch block 156 comprises a quantization and limiting block 304.

The quantization and limiting block 304 is configured to round and clip the F_MOD signal at the same levels as the quantization and limiting block 204 of the modulation range reduction block 154. However, the clipping is performed in units of frequency, rather than, as for the quantization and limiting block 204 of the modulation range reduction block 154.

To mimic the clipping performed by the quantization and limiting block 204 of the modulation range reduction block 154, the clipping range of the quantization and limiting block 204 of the modulation range reduction block 154, as expressed in units of capacitors of the "MOD" bank 134 is translated into units of frequency by the quantization and limiting block 304 of the compensation branch block 156 using the modulation gain K_mod 152, as received from the modulation gain estimation stage 150.

Thus, the quantization and limiting block 304 of the compensation branch block 156 uses the modulation gain K_mod 152 to convert from units of capacitors to units of frequency, rather than, as the input block 202 of the of the modulation range reduction block 154, from units of frequency to units of capacitors.

Thus, the quantization and limiting block 304 of the compensation branch block 156 is configured for mimicking the clipping of the modulation range reduction block 154.

Further, the compensation branch block 156 comprises a delay block 306. Just as in the modulation range reduction block 154, the delay block 306 is input with a difference between the input and the output of the quantization and limiting block 304, as calculated by a subtractor 312, and additively output, through an adder 310, with a delay, of typically one modulation cycle, provided by the delay block 306, to the input of the quantization and limiting block 304, so that in the next modulation cycle the error is added on top of the signal going into the quantization and limiting block 304. This mimics the feedback loop of the modulation range reduction block 154, for averaging out, in time, the phase error caused by the quantization and/or clipping.

The present disclosure has mainly been described with reference to a limited number of examples. However, as is readily appreciated by a person skilled in the art, other examples than the ones disclosed above are equally possible within the scope of the present disclosure, as defined by the appended claims.

For example, the feedback loops created by the delay blocks 206 and 206 may be replace by respective feed-forward arrangements, or a combination of feed-forward and feed-back arrangements.

As a further example, alternative to receiving the output of the TDC, the modulation gain estimation stage 150 may receive a state of the PLL 146 in the form of information regarding a switching state of one or more of the capacitor banks 126, 128, 130, i.e., information on which capacitors are switched into the DCO 104, and calculate the modulation gain based on that switching state and the frequency information in the form of the frequency modulation word F_MOD or frequency control word FCW.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A signal generator having:
   a nominal frequency control input, and
   a modulation frequency control input and comprising:
      an oscillator, with:
         a first set of capacitors at least partially switchably connectable for adjusting a frequency of said oscillator as part of a phase-locked loop, PLL, as set by the nominal frequency control input, and
         a second set of capacitors comprised in a modulation, MOD, stage of the oscillator, switchably connectable for modulating the frequency and controlled by the modulation frequency control input;
      a modulation gain estimation stage configured to determine, derived from the modulation frequency control input and a state of the PLL, a frequency-to-capacitor modulation gain; and
      a modulation range reduction module connected between the modulation frequency input and the modulation stage and configured for:
         clipping a modulation range of the oscillator to a range achievable using the second set of capacitors, using the modulation gain;
         averaging out, in time, a phase error caused by the clipping; and
         mimicking the clipping, additively output to the nominal frequency control input to compensate the PLL for the modulation.

2. The signal generator of claim 1, wherein the state of the PLL is a time-to-digital converter, TDC, output.

3. The signal generator of claim 1, wherein the modulation range reduction module comprises a modulation range reduction block providing the clipping and the averaging, the modulation range reduction block comprising:
   an input block converting the modulation frequency control to units of capacitors using the modulation gain;
   a quantization and limiting block providing the clipping and output to the modulation stage; and
   a delay block input with a difference between an input and an output of the quantization and limiting block and additively output to the input of the quantization and limiting block.

4. The signal generator of claim 1, wherein the modulation range reduction module comprises a compensation branch block providing the mimicking, the compensation branch block comprising:
   a quantization and limiting block mimicking the clipping of the of the modulation range reduction block; and
   a delay block input with a difference between an input and an output of the quantization and limiting block and additively output to the input of the quantization and limiting block.

5. The signal generator of claim 1, wherein the oscillator is a digitally-controlled oscillator, DCO.

6. The signal generator of claim 5, wherein the capacitances of the first set of capacitors and the second set of capacitors are added together for digitally controlling the frequency of the DCO.

7. The signal generator of claim 6, wherein first set of capacitors and the second set of capacitors comprise a process voltage and temperature, PTV, bank for coarse frequency control.

8. The signal generator of claim 7, wherein the PTV bank comprises a fixed capacitance.

9. The signal generator of claim 6, wherein the first set of capacitors and the second set of capacitors comprise an ACQ bank for medium frequency control.

10. The signal generator of claim 9, wherein the ACQ bank comprises a fixed capacitance.

11. The signal generator of claim 6, wherein the first set of capacitors and the second set of capacitors comprise a TRK bank for fine frequency control.

12. The signal generator of claim 11, wherein the TRK bank comprises a fixed capacitance.

13. The signal generator of claim 1, wherein the PLL is an all-digital phase-locked loop, AD-PLL.

14. The signal generator of claim 1, wherein the signal generator forms part of a wireless transmitter.

15. The signal generator of claim 1, wherein the signal generator forms part of a wireless transceiver.

* * * * *